(12) United States Patent
McLaurin et al.

(10) Patent No.: US 7,085,978 B2
(45) Date of Patent: Aug. 1, 2006

(54) VALIDATING TEST SIGNAL CONNECTIONS WITHIN AN INTEGRATED CIRCUIT

(75) Inventors: Teresa Louise McLaurin, Dripping Springs, TX (US); Peter Logan Harrod, Cambridge (GB); Raul Armando Garibay, Austin, TX (US)

(73) Assignee: ARM Limited, Cambridge (GB)

( * ) Notice: Subject to any disclaimer, the term of this patent is extended or adjusted under 35 U.S.C. 154(b) by 320 days.

(21) Appl. No.: 10/244,561

(22) Filed: Sep. 17, 2002

(65) Prior Publication Data

US 2004/0054948 A1 Mar. 18, 2004

(51) Int. Cl.
*G01R 31/28* (2006.01)

(52) U.S. Cl. .................................... 714/726
(58) Field of Classification Search ............... 714/724, 714/726, 727, 729, 30, 733
See application file for complete search history.

(56) References Cited

U.S. PATENT DOCUMENTS 6,446,230 B1 *  9/2002  Chung ...................... 714/726
6,560,740 B1 *  5/2003  Zuraski et al. ............. 714/733

* cited by examiner

*Primary Examiner*—Albert Decady
*Assistant Examiner*—James C. Kerveros
(74) *Attorney, Agent, or Firm*—Nixon & Vanderhye P.C.

(57) ABSTRACT

Testing of the test signal connections to a functional block of circuitry within an integrated circuit is made using wrapper serial scan chain cells of a wrapper serial scan chain. These wrapper cells can then be used to validate that the correct signals are reaching test signal inputs and the correct signals are reaching their destination from test signal outputs when that functional block of circuitry is incorporated within a larger design, e.g., a system-on-chip design.

16 Claims, 7 Drawing Sheets

VALIDATING TEST SIGNAL CONNECTIONS WITHIN AN INTEGRATED CIRCUIT

BACKGROUND OF THE INVENTION

1. Field of the Invention

This invention relates to data processing systems. More particularly, this invention relates to the validating of test signal connections within an integrated circuit.

2. Description of the Prior Art

It is known to provide testing mechanisms within an integrated circuit which may be used for test purposes, such as manufacturing tests. Accordingly, it is known to provide a functional block of circuitry with associated test circuitry, such as a wrapper serial scan chain.

There is also a trend toward more system-on-chip designs whereby multiple functional blocks of circuitry are combined on a single integrated circuit to produce an overall system. In this context, it is often the case that different organisations will be responsible for the design of different functional blocks of circuitry. These designs may be supplied separately to the organisation which will then integrate them together to produce the system-on-chip integrated circuit and manufacture that integrated circuit.

A problem that arises in this context is that the organisations which supply the designs of functional blocks of circuitry may seek to protect their designs by releasing them an encrypted form which places restrictions upon the modification of those designs and seeks to prevent detailed information concerning those designs being made public. In order that the system-on-chip integrator may test their product it is known for the supplier of the functional block of circuitry to also supply a set of test vectors (sets of signal values) which may be applied to that functional block of circuitry to test it for correct operation. In order for this testing to operate, the system-on-chip integrator must provide correct and properly functional connections to the test mechanisms built into the functional block of circuitry such that the supplied set of test vectors may properly reach those testing mechanisms and be read from those testing mechanisms. It is accordingly important that the system-on-chip integrator should be able to validate their system-on-chip design in respect of the connections to the testing mechanisms of the functional block of circuitry. One way of achieving this would be to supply the system-on-chip integrator with an encrypted model of the circuit including the testing mechanisms which could be validated using standard validation tools. However, there is a considerable variation in the way different testing mechanisms may be set up for different individual designs and accordingly this involves the originator of the functional block of circuitry having to produce many different encrypted functional models. Furthermore, there are risks associated with the use of encryption in protecting important information as unauthorised decryption techniques might be able to access the confidential design information without the originator being able to stop this.

SUMMARY OF THE INVENTION

Viewed from one aspect the present invention provides an integrated circuit comprising:

a functional block of circuitry;

a wrapper serial scan chain having a plurality of wrapper serial scan chain cells and operable to apply input signals to said function block of circuitry and to capture output signals from said functional block of circuitry as a test operation;

test circuitry operable to perform at least one further test operation upon said functional block of circuitry, said test circuitry having a plurality of test signal connections to parts of said integrated circuit other than said test circuitry; wherein in a check mode, one or more wrapper serial scan chain cells of said wrapper serial scan chain are coupled to respective ones of said test signal connections to allow testing of said test signal connections using said wrapper serial scan chain.

The invention recognises that the validation of the functional block of circuitry including its testing mechanisms may be properly achieved within a system-on-chip design if it can be checked that the test signal connections are correctly made to the functional block of circuitry since the originator of the design of that functional block of circuitry can already have checked that the design within that signal interface boundary is correct and properly functional. Thus, a wrapper serial scan chain may be used to test the test signal connections to the functional block of circuitry during validation since the wrapper model is normally non-confidential and available to the system-on-chip integrator. Whilst it would be possible to provide a dedicated wrapper for checking these test signal connections, preferred embodiments of the invention reuse a wrapper for the functional circuitry during this validation of the test signal connections and accordingly correct operation of the functional circuitry wrapper can be confirmed by its ability to check the test signal connections properly.

In order to check that a test signal input is correctly connected within an integrated circuit a wrapper serial scan chain may be coupled to that test signal input to enable validation of the connection to be made by checking that the wrapper serial scan chain cell is able to capture the correct test signal input.

In a complementary way a test signal output may be checked for correct connection to the rest of the system by using a signal within a wrapper serial scan chain cell to drive out from that test signal output to see if the correct signal then reaches its destination.

In order to reduce the number of wrapper serial scan chain cells that need to be dedicated to providing this test signal testing preferred embodiments reuse a wrapper serial scan chain cell coupled to a test signal input to also provide the known output signal to be driven out from a test signal output.

In such embodiments it is preferred to use a multiplexer to operate in check mode to select the signal stored in the wrapper serial scan chain cell to be output from the test signal output rather than the normal test signal output signal. Placing a multiplexer in this path is generally not timing critical since testing is normally not performed at the full process-limited clock rate.

In a similar way a wrapper serial scan chain cell that is normally used for a non-test connection of the functional block of circuitry may be reused in the check mode to couple to a test signal connection in order to test that test signal connection and then revert to its non-test connection during the normal manufacturing test use or other validations.

It will be appreciated that the testing circuitry which is itself tested using the current technique could take a wide variety of forms but advantageously includes one or more further wrapper serial scan chains or connections to segments of a wrapper serial scan chain. In order to provide comprehensive test signal testing preferred embodiments serve to couple all test signal connections to the test circuitry to respective wrapper serial scan chain cells.

When dedicated wrapper serial scan chain cells are provided for the testing of test connections, the increased overhead in terms of chain lengths within the wrapper may be mitigated by bypassing such dedicated cells when they are not required.

Viewed from another aspect the invention also provides a method of validating an integrated circuit design including
a functional block of circuitry;
a wrapper serial scan chain having a plurality of wrapper serial scan chain cells and operable to apply input signals to said function block of circuitry and to capture output signals from said functional block of circuitry as a test operation;
test circuitry operable to perform at least one further test operation upon said functional block of circuitry, said test circuitry having a plurality of test signal connections to parts of said integrated circuit other than said test circuitry;
said method comprising the step of:
in a check mode, coupling one or more wrapper serial scan chain cells of said wrapper serial scan chain to respective ones of said test signal connections to test said test signal connections using said wrapper serial scan chain.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
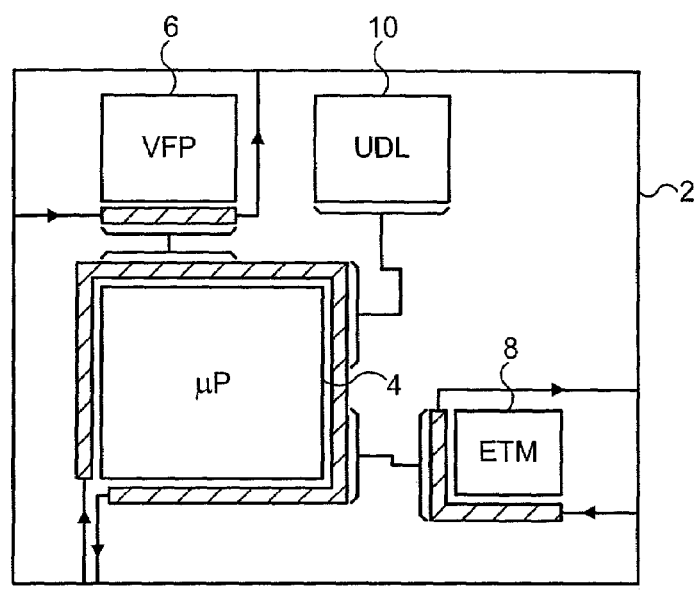
FIG. 1 schematically illustrates a system-on-chip integrated circuit including a plurality of functional blocks of circuitry.
Figure 6:
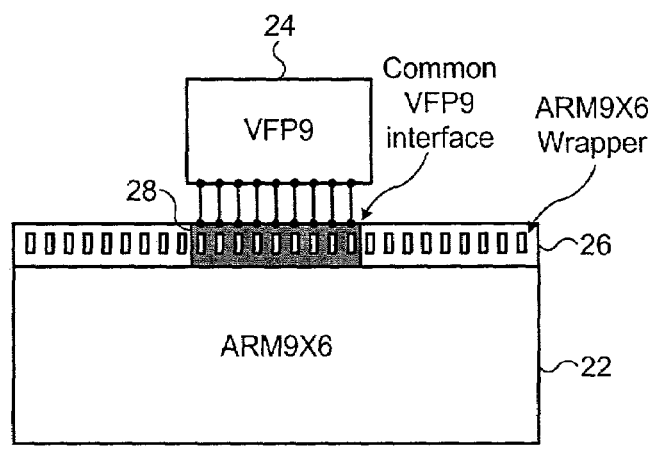
FIG. 6 is a diagram schematically illustrating the relationship between two functional blocks of circuitry with a segment of a wrapper serial scan chain being shared between the two functional blocks of circuitry.

FIG. 1 schematically illustrates an integrated circuit 2 incorporating multiple functional blocks of circuitry including a microprocessor core 4, a coprocessor being in this particular example a vector floating point unit 6, an embedded trace module 8 and user defined logic 10. The microprocessor core 4, the vector floating point unit 6 and the embedded trace module 8 have associated wrapper serial scan chains which can be used to apply test vectors to those circuit elements. The integrated circuit 2 is a system-on-chip design incorporating multiple functional blocks, which may be sourced from different suppliers and of which the system-on-chip integrator need not necessarily have full knowledge regarding their internal design. It will be appreciated that whilst FIG. 6 illustrates a coprocessor in the form of a vector floating point unit 24 connected to a microprocessor in the form of an ARM9X6 microprocessor 22, many different possibilities exist for the first and second functional blocks of circuitry, such as coprocessors in general and microprocessors in general When it is desired to test the user defined logic 10 which does not have its own wrapper serial scan chain, it is necessary to scan in a test vector to the wrapper serial scan chain of the microprocessor core 4 and then perform an EXTEXT operation such that the relevant signals are driven out to the user defined logic 10 and/or captured from the user defined logic 10.

Figure 2:
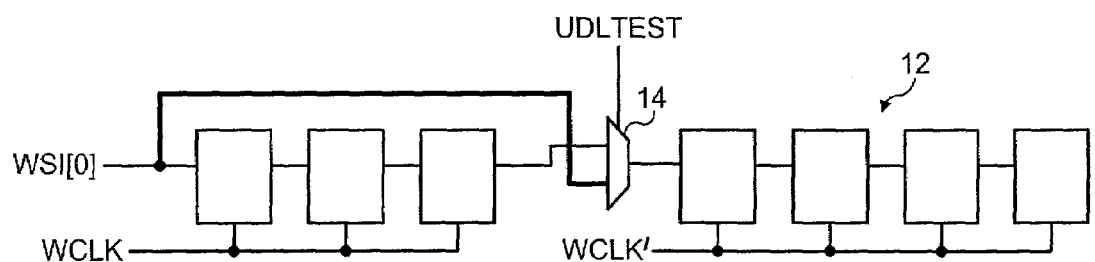
FIG. 2 schematically illustrates a wrapper serial scan chain which is functionally segmented.

FIG. 2 schematically illustrates how a wrapper serial scan chain may be provided with a wrapper serial scan chain segment 12 which can be used to apply test vectors to the user defined logic 10 whilst the rest of the wrapper serial scan chain cells are bypassed. The multiplexer 14 acting under control of a mode selecting signal UDLTEST serves to bypass a portion of the full wrapper serial scan chain cell such that shorter test vectors including only those signal values needed for the user defined logic 10 can be scanned into and out of the selected segment 12. It will be appreciated that the action of the multiplexer 14 is to functionally segment the wrapper serial scan chain cell as a whole so as to achieve more rapid testing.

Figure 3:
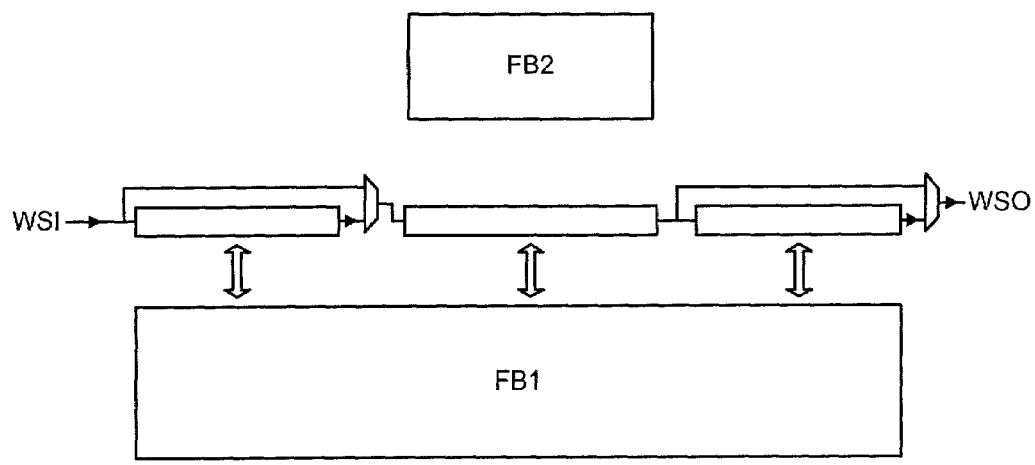
FIGS. 3 and 4 schematically illustrate the operation of a wrapper serial scan chain in different segmented modes.
Figure 4:
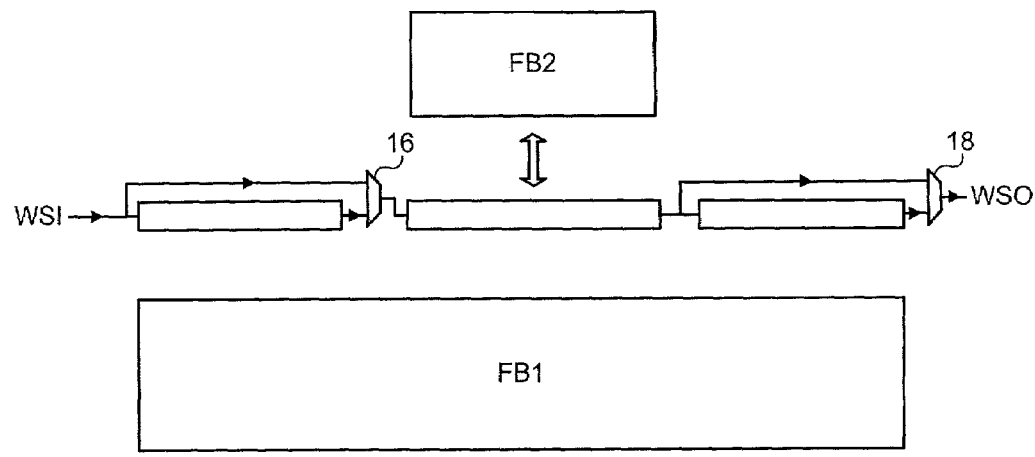

FIGS. 3 and 4 schematically illustrate two modes of operation of a wrapper serial scan chain 14. In FIG. 3 the full wrapper serial scan chain is being used and the test vectors scanned therein are applied to the first functional block of circuitry FB1. This corresponds to the normal mode of operation of such a wrapper serial scan chain. FIG. 4 illustrates a mode of operation in which multiplexers 16, 18 serve to bypass an initial and final portion of the wrapper serial scan chain respectively such that only a central portion of the wrapper serial scan chain is active. This central portion serves as the wrapper serial scan chain segment which is used to apply test signals to and capture test signals from the second functional block of circuitry FB2.

Figure 5:
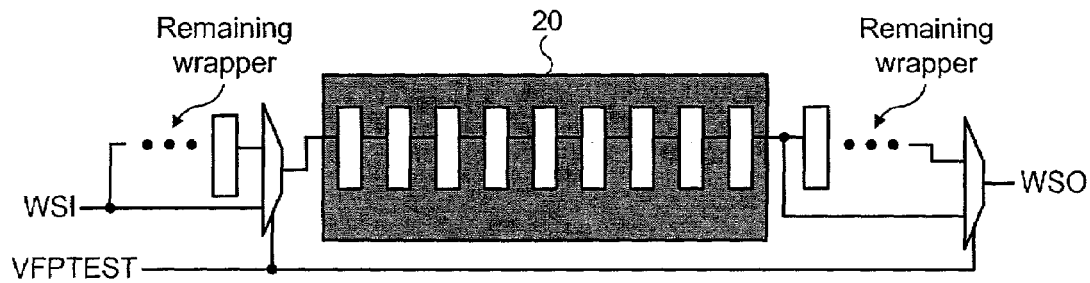
FIG. 5 is another view of a wrapper serial scan chain showing the wrapper serial scan chain cells associated with a particular functional block of circuitry.

FIG. 5 illustrates another embodiment of the invention in which the wrapper serial scan chain segment 20 is part of the wrapper serial scan chain of a microprocessor core and is reused to provide the wrapper serial scan chain of coprocessor, such as a vector floating point unit. This reduces the gate count of the overall system since separate circuit elements do not have to be provided to perform the role of a separate wrapper serial scan chain of the vector floating point unit. This technique has the consequence that it is desirable that the signal interface between the vector floating point and the microprocessor core should remain consistent and consistently routed through the wrapper serial scan chain across multiple designs in order to achieve the advantage of enabling the re-use of test vectors across different designs using the vector floating point unit. Thus, if the signal interface is kept consistent irrespective of the particular version of the microprocessor core being used or the particular version of the vector floating point unit (providing its functionality is consistent), then a common vector set may be developed and used with a consequent saving in the amount of time required to generate such test vector sets.

FIG. 6 schematically illustrates the arrangement of FIG. 5 in another way. In FIG. 6, the microprocessor core 22 and the vector floating point unit 24 are both connected to a wrapper serial scan chain 26. The wrapper serial scan chain segment 28 is functionally delimited as that portion which interfaces with the vector floating point unit 24 and reuses the same wrapper scan chain cells for the role of testing both the vector floating point unit 24 and a portion of the microprocessor core 22.

FIG. 6 shows the reuse of wrapper scan chain cells to provide the whole of the wrapper scan chain of another functional block of circuitry. However, there may be some functional blocks of circuitry which are able to share wrapper cells for part of their signal interface which is always common with another functional block of circuitry whilst requiring some of their own dedicated wrapper scan chain cells to deal with their unique control signals. An example of such a functional block of circuitry would be the embedded trace module 8 shown in FIG. 1 which interfaces both with the microprocessor core 4 and with external elements.

It will also be seen from FIG. 1 that the wrapper serial scan chains of these example embodiments take their input and output from external pins of the integrated circuit to enable manufacturing test.

Whilst not directly connected with the wrapper serial scan chain segmentation technique described above, a factor when testing integrated circuits in accordance with this technique is that should reset signals be present within the wrappers, then these should be appropriately gated when in the test modes to ensure that the wrapper serial scan chain cells are not inappropriately reset resulting in incorrect test operation. In a similar way enable signals used within wrapper serial scan chain cells should be carefully controlled to be held at a level whereby the scanning operation required during test is possible.

Figure 7:
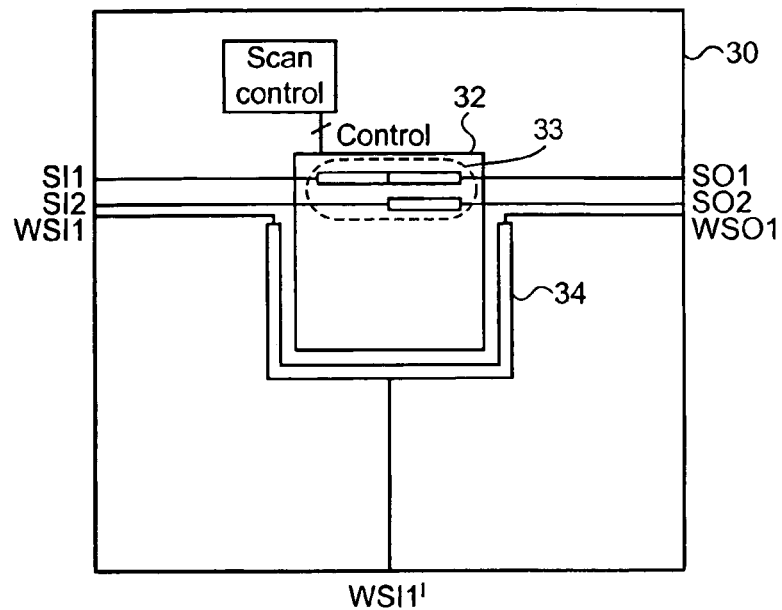
FIG. 7 schematically illustrates an integrated circuit with test signal connections to a functional block of circuitry.

FIG. 7 schematically illustrates an integrated circuit 30 including a functional block of circuitry 32 which has both a wrapper serial scan chain 34 and other test circuitry 33 associated with it. The integrated circuit 30 of FIG. 7 includes many more functional blocks of circuitry as is consistent with a system-on-chip design, but these have been omitted from FIG. 7 for the sake of clarity. When a system-on-chip integrator produces their integrated circuit 30, they must combine the functional blocks of circuitry necessary and make the appropriate signal connections between those functional blocks of circuitry as well as between external pins and those functional blocks of circuitry. The making of these connections in the correct way is important for the correct operation of the integrated circuit 30 and requires validation before committing to the expense of manufacturing a particular design. Whilst the designer of a particular functional block of circuitry may have validated that their functional block of circuitry operates correctly in all circumstances providing the correct signals are applied to it, and have developed a set of test vectors for testing for correct manufacture of that functional block of circuitry, there is the complication that such testing circuitry associated with the functional block of circuitry 32 must be correctly connected to other elements internal of the integrated circuit 30, or more likely external of the integrated circuit 30, such that the appropriate test signals will be applied to the test circuitry 33 during manufacturing tests.

The invention recognises that it is not necessary for the system-on-chip integrator to validate themselves the correct full operation of the test circuitry as this will already have been done by the originator of that design, rather what is required is to validate that the connections have been correctly made to that test circuitry. This reduces the amount of information that the originator of a design needs to release to the system-on-chip integrator and also reduces the workload of the system-on-chip integrator.

Figure 8:
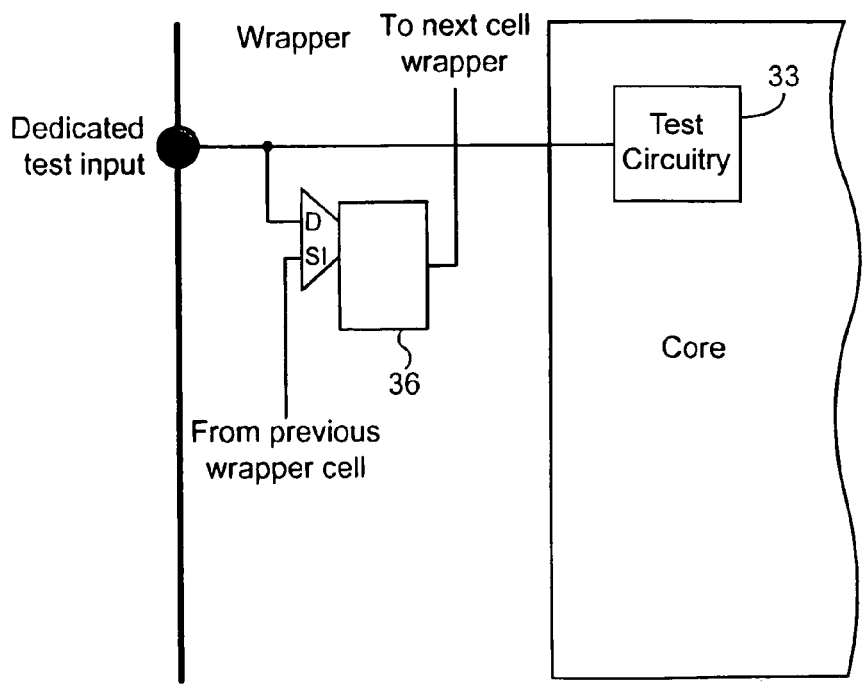
FIG. 8 illustrates the use of a wrapper serial scan chain cell to test a dedicated test input.

FIG. 8 illustrates the use of a wrapper serial scan chain cell 36 from within the wrapper serial scan chain 34 to be coupled to a dedicated test input to the test circuitry 33 in the functional block of circuitry 32 during a check mode for checking that that test signal connection has been made correctly. More particularly, in the check mode, the signal input to the dedicated test input is captured within the wrapper serial scan chain cell 36 from where it can be recovered by scanning out from the wrapper serial scan chain 34. It will be understood that the application of a test signal input, which if the connections have been made correctly should reach the dedicated test input in the appropriate form, the capture of this signal as it reaches the dedicated test input and the scanning out of this signal from the wrapper serial scan chain all take place in a simulation environment of the integrated circuit in order to validate the design of that integrated circuit. This simulated (validation) environment may be provided by one of a variety of different software tools. The wrapper serial scan chain cells 36 remain in place in the actual manufactured circuit as it would not be appropriate to change the design in any way after it has been validated and furthermore it may be desirable during manufacturing testing also to be able to check that the dedicated test inputs are correctly reaching their targets. This example shows wrapper serial scan chain cells within the wrapper for the functional circuitry being used to check the test connections. It would also be possible to provide a dedicated separate wrapper with its own cells and port to test the test connections.

Figure 9:
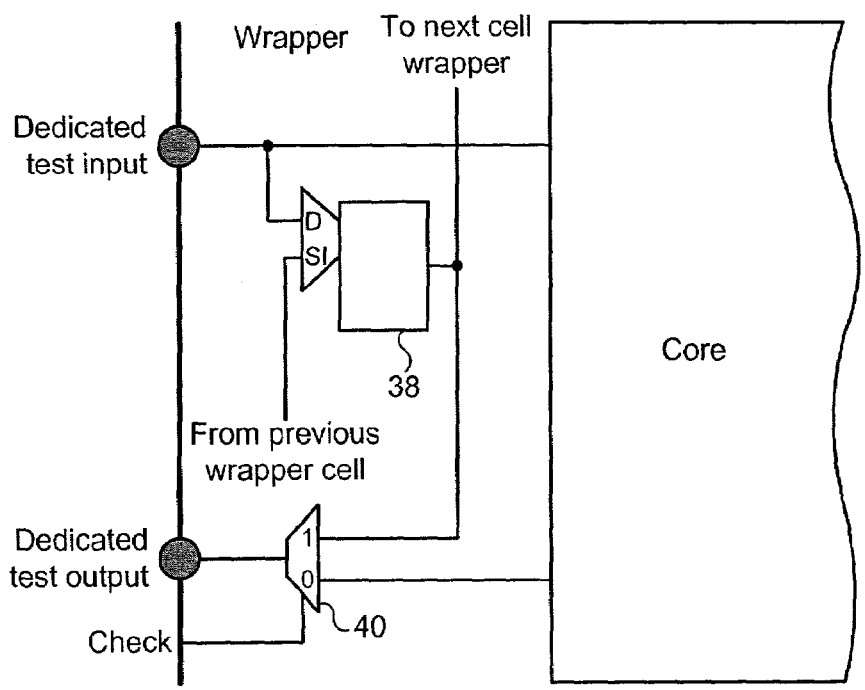
FIG. 9 illustrates the use of a wrapper serial scan chain cell associated with a dedicated test input to also test a dedicated test output.

FIG. 9 illustrates how a wrapper serial scan chain cell 38 may be shared to test both a dedicated test input and a dedicated test output. In the check mode, a test input signal is applied and captured by the wrapper serial scan chain cell 38. That same signal (which will be of a known value) is also selected by the multiplexer 40 in the check mode to be output from the dedicated test output and accordingly can be read at its intended destination to check that the dedicated test output is correctly connected to its intended destination. Thus, the connection to the dedicated test input is checked by scanning out captured data from the wrapper serial scan chain cell 38 and making sure that this corresponds to what was intended whilst the dedicated test output is checked by ensuring that the appropriate signal value reaches the intended destination having originated within the wrapper serial scan chain cell 38 and been routed via the multiplexer 40 to the dedicated test output of the functional block of circuitry.

Figure 10:
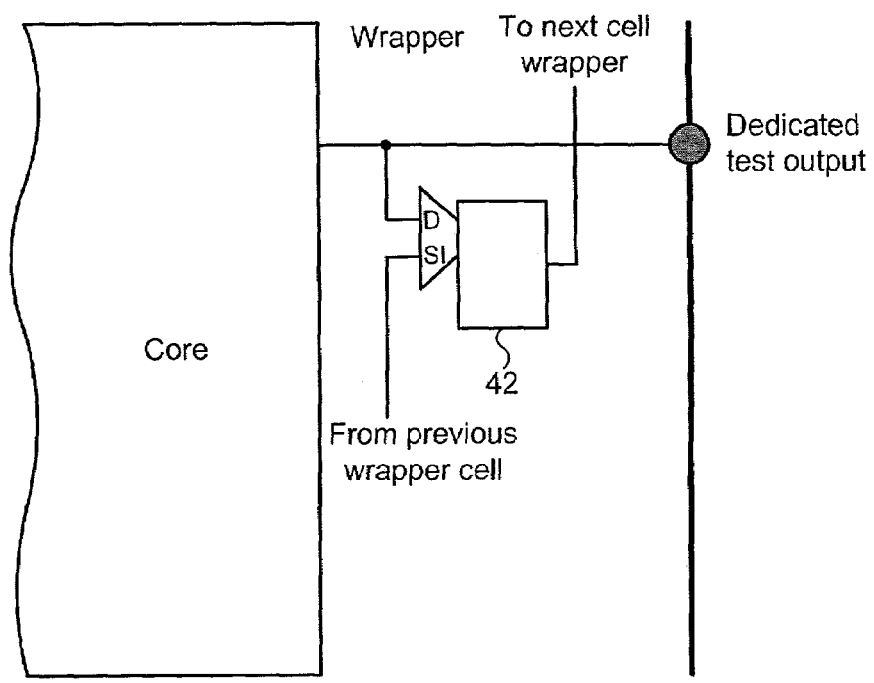
FIG. 10 illustrates the use of a wrapper serial scan chain cell to test a dedicated test output.

FIG. 10 illustrates another embodiment for testing dedicated test outputs. In this embodiment a dedicated wrapper serial scan chain cell 42 is provided purely for testing purposes of the dedicated test output. Accordingly, a test output signal which is to be generated is captured by the wrapper serial scan chain cell 42 and then routed via the dedicated test output and the associated test connection to its intended destination. The output signal applied by the wrapper cell will be known since it was scanned into the wrapper serial scan chain and thus may be compared with the value that reached its intended destination to ensure that they match.

Figure 11:
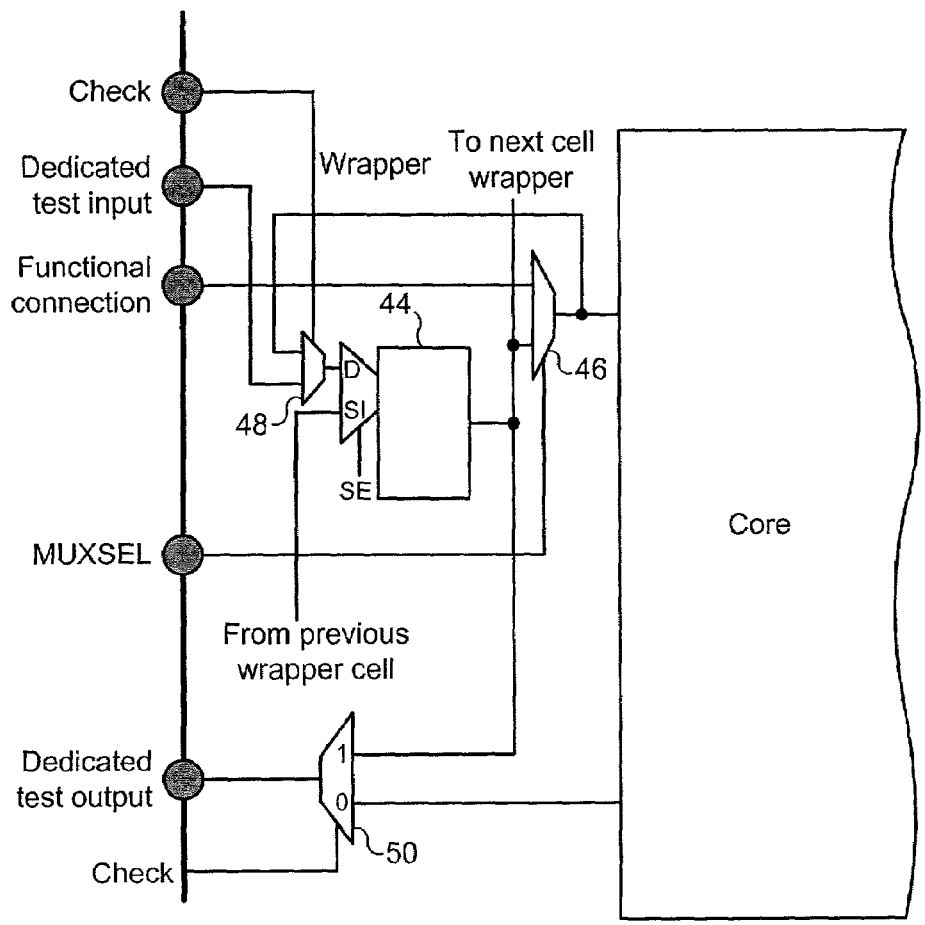
FIG. 11 illustrates the use of a wrapper serial scan chain cell that is associated with a normal functional signal (non-test) to also test a dedicated test input and a dedicated test output.

FIG. 11 illustrates another embodiment in which a wrapper serial scan chain cell 44 which is used in other than the check mode for wrapper testing of a functional connection may be used in the check mode for validating the correct connection of a dedicated test input and a dedicated test output. A multiplexer 46 controlled by a multiplexer control signal MUXSEL is used to select either the normal functional signal or a signal from the wrapper serial scan chain cell 44 to be applied to the functional block of circuitry.

When in a non-check mode, the functional signal being applied may be captured within the wrapper serial scan chain cell 44 via a feedback path from the multiplexer 46 or alternatively the functional connection may be driven with a signal within the wrapper serial scan chain 44 which has been scanned in as part of a test vector.

In the check mode, multiplexers 48, 50 serve to direct a signal received at the dedicated test input to be captured at the wrapper serial scan chain cell 44 whilst selecting a signal within the wrapper serial scan chain 44 to be output from the dedicated test output.

Figure 12:
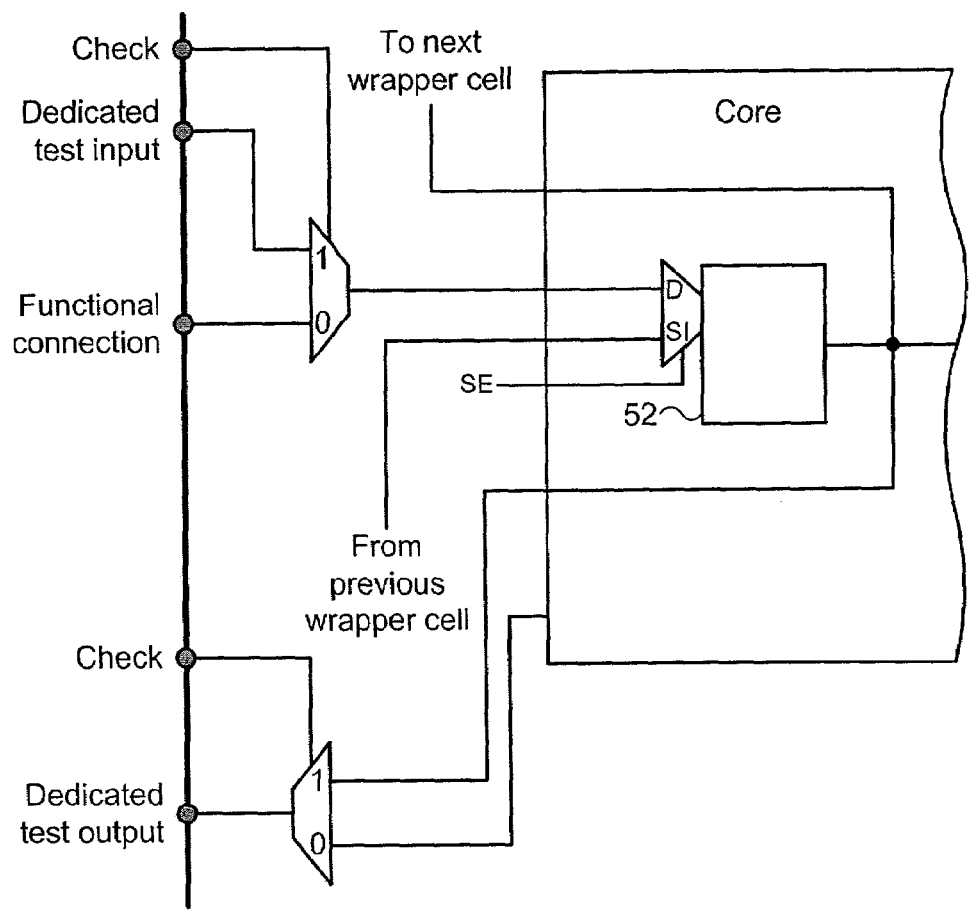
FIG. 12 illustrates a latch within a functional block of circuitry being reused as a wrapper serial scan chain cell for testing test connections.

FIG. 12 illustrates a further variation in which a latch 52 within the functional circuitry itself is reused as a wrapper serial scan chain cell. In non-check operation, the signal applied to the functional connection is routed to the latch 52. In check operation, the dedicated test input signal is routed to the latch 52 and a dedicated test output signal sourced from the latch 52. Whilst the embodiment of FIG. 12 reduces the gate requirement needed to provide the wrapper serial scan chain cells for test connection testing, it has the disadvantage of introducing an additional multiplexer (and consequent signal delay) in the functional signal path required during normal operation of the functional block of circuitry.

Figure 13:
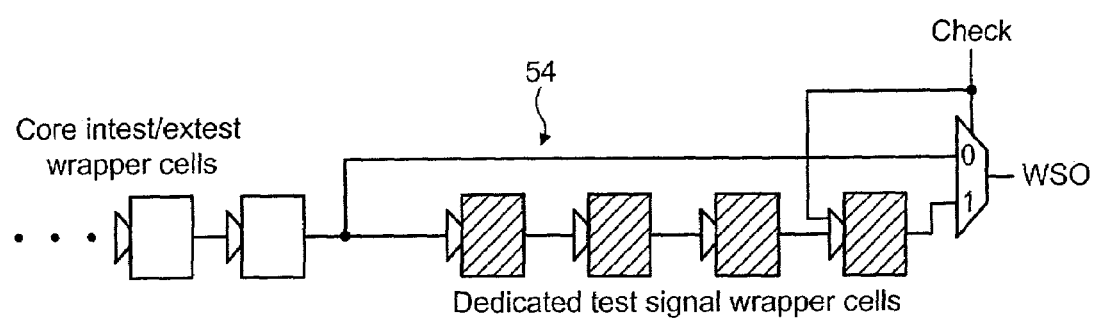
FIG. 13 schematically illustrates a wrapper serial scan chain in which dedicated test signal wrapper cells are bypassed when not operating in a check mode.

FIG. 13 illustrates a wrapper serial scan chain 54 including four dedicated wrapper serial scan chain cells which serve the purpose of testing test connections. These dedicated test signal wrapper cells are only normally used during validation of the design and not used during normal manufacturing test. Accordingly, in order to speed up normal manufacturing tests, these wrapper serial scan chain cells may be selectively bypassed using a multiplexer controlled by the check mode signal.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
   a functional block of circuitry;
   a wrapper serial scan chain having a plurality of wrapper serial scan chain cells; and
   test circuitry separate from the wrapper serial scan chain and operable to perform at least one test operation upon said functional block of circuitry, said test circuitry having a plurality of test signal connections extending between said test circuitry and parts of said integrated circuit other than said test circuitry, said dedicated test signal connections being exclusively used for test operations;
   wherein in a check mode, one or more wrapper serial scan chain cells of said wrapper serial scan chain are coupled to respective ones of said dedicated test signal connections to allow testing of said dedicated test signal connections using said wrapper serial scan chain,
   wherein a wrapper serial scan chain cell is coupled to a dedicated test signal input to said test circuitry to allow capture of a test signal reaching said dedicated test signal input, and
   wherein a wrapper serial scan chain cell is coupled to a dedicated test signal output from said test circuitry to allow driving of a known signal value out from said dedicated test signal output.

2. An integrated circuit as claimed in claim 1, wherein said wrapper serial scan chain is also operable to apply input signal to said functional block of circuitry and to capture output signals from said functional block of circuitry as a test operation.

3. An integrated circuit as claimed in claim 1, wherein a wrapper serial scan chain cell is also coupled to a dedicated test signal input to said test circuitry to allow capture of a test signal reaching said dedicated test signal input.

4. An integrated circuit as claimed in claim 3, wherein a multiplexer is operable in said check mode to select a signal value stored in said wrapper serial scan chain cell to be output from said dedicated test signal output.

5. An integrated circuit as claimed in claim 1, wherein a wrapper serial scan chain cell is selectively coupled to either a non-test connection of said functional block of circuitry or a dedicated test signal connection of said functional block of circuitry.

6. An integrated circuit as claimed in claim 1, wherein a latch within said functional block of circuitry is used as a wrapper serial scan chain cell coupled to a dedicated test signal connection during said check mode.

7. An integrated circuit as claimed in claim 1, wherein all dedicated test signal connections to said test circuitry are coupled to a respective wrapper serial scan chain cells.

8. An integrated circuit as claimed in claim 1, wherein said wrapper serial scan chain is operable to bypass wrapper serial scan chain cells dedicated to testing of said dedicated test signal connections during serial scan operations.

9. A method of validating an integrated circuit design including a functional block of circuitry;
   a wrapper serial scan chain separate from the wrapper serial scan chain and having a plurality of wrapper serial scan chain cells and operable to apply input signals to said function block of circuitry and to capture output signals from said functional block of circuitry as a test operation;
   test circuitry operable to perform at least one further test operation upon said functional block of circuitry, said test circuitry having a plurality of dedicated test signal connections extending between said test circuitry and parts of said integrated circuit other than said test circuitry, said dedicated test signal connections being exclusively used for test operations;
   wherein a wrapper serial scan chain cell is coupled to a test signal input to said dedicated test circuitry and further comprising capturing a test signal reaching said dedicated test signal input, and
   wherein a wrapper serial scan chain cell is coupled to a test signal output from said dedicated test circuitry and further comprising driving of a known signal value out from said dedicated test signal output, said method comprising the step of:

in a check mode, coupling one or more wrapper serial scan chain cells of said wrapper serial scan chain to respective ones of said dedicated test signal connections to test said dedicated test signal connections using said wrapper serial scan chain.

10. A method as claimed in claim 9, wherein said wrapper serial scan chain is also operable to apply input signal to said functional block of circuitry and to capture output signals from said function block of circuitry as a test operation.

11. A method as claimed in claim 9, wherein said wrapper serial scan chain cell is also coupled to a test signal input to said dedicated test circuitry and further comprising capturing a test signal reaching said test signal input.

12. A method as claimed in claim 11, comprising in said check mode selecting with a multiplexer a signal value stored in said wrapper serial scan chain cell for output from said dedicated test signal output.

13. A method as claimed in claim 9, comprising selectively coupling a wrapper serial scan chain cell to either a non-test connection of said functional block of circuitry or a dedicated test signal connection of said functional block of circuitry.

14. An integrated circuit as claimed in claim 9, wherein a latch within said functional block of circuitry is used as a wrapper serial scan chain cell coupled to a dedicated test signal connection during said check mode.

15. A method as claimed in claim 9, wherein all dedicated test signal connections to said test circuitry are coupled to a respective wrapper serial scan chain cells.

16. An integrated circuit as claimed in claim 9, wherein wrapper serial scan chain cells dedicated to testing of said test signal connections may be bypassed during serial scan operations.

* * * * *